United States Patent
Szlufcik et al.

(10) Patent No.: US 7,196,018 B2
(45) Date of Patent: Mar. 27, 2007

(54) SEMICONDUCTOR ETCHING PASTE AND THE USE THEREOF FOR LOCALIZED ETCHING OF SEMICONDUCTOR SUBSTRATES

(75) Inventors: Jozef Szlufcik, Kessel-Lo (BE); Emmanuel Van Kerschaver, Wezemaal (BE); Christophe Allebé, Orbais (BE)

(73) Assignee: Interuniversitair Microelektronica Centrum vzw, Leuven (BE)

( * ) Notice: Subject to any disclaimer, the term of this patent is extended or adjusted under 35 U.S.C. 154(b) by 184 days.

(21) Appl. No.: 10/609,015

(22) Filed: Jun. 27, 2003

(65) Prior Publication Data

US 2004/0063326 A1    Apr. 1, 2004

(30) Foreign Application Priority Data

Jul. 1, 2002    (EP) .................. 02014524

(51) Int. Cl.
    *H01L 21/302*    (2006.01)
(52) U.S. Cl. .................. 438/745; 438/750; 252/79.1
(58) Field of Classification Search ............. 438/745, 438/750; 252/79.1, 79.2; 216/24, 83, 96
    See application file for complete search history.

(56) References Cited

U.S. PATENT DOCUMENTS

| | | | |
|---|---|---|---|
| 4,584,055 A | 4/1986 | Kayanoma et al. | |
| 4,605,689 A | 8/1986 | Witheford et al. | |
| 4,781,792 A | 11/1988 | Hogan | |
| 5,296,043 A | 3/1994 | Kawakami et al. | |
| 5,357,899 A | 10/1994 | Bassous et al. | |
| 5,461,002 A | 10/1995 | Safir | |
| 5,688,366 A | 11/1997 | Ichinose et al. | |
| 5,698,451 A | 12/1997 | Hanoka | |

(Continued)

FOREIGN PATENT DOCUMENTS

DE    3422454 A1    12/1985

(Continued)

OTHER PUBLICATIONS

"High throughput laser isolation of crystalline silicon solar cells", G. Emanuel, 17th European Photovoltaic Solar Energy Conference and Exhibition, Munich, Germany, Oct. 22-27, 2001.

(Continued)

*Primary Examiner*—Lan Vinh
(74) *Attorney, Agent, or Firm*—Knobbe Martens Olson & Bear LLP

(57) ABSTRACT

A method of etching a semiconductor substrate is described, the method comprising the steps of applying a paste containing an etchant to the substrate, and carrying out a thermal processing step to etch a part or a layer of the substrate where the paste has been applied. The etchant paste is preferably a caustic etching paste. The etchant paste may be applied selectively to a major surface of the substrate to form a pattern of applied paste. For example, the paste may be applied by a printing method, such as screen-printing. The method may be used to produce solar cells.

32 Claims, 6 Drawing Sheets

U.S. PATENT DOCUMENTS

| | | |
|---|---|---|
| 5,726,065 A | 3/1998 | Szlufcik et al. |
| 5,894,853 A | 4/1999 | Fujisaki et al. |
| 5,949,123 A | 9/1999 | Lee et al. |
| 6,163,313 A | 12/2000 | Aroyan et al. |
| 6,384,317 B1 | 5/2002 | Kerschaver et al. |
| 6,388,187 B1 | 5/2002 | Takeyama et al. |
| 6,416,818 B1 | 7/2002 | Aikens et al. |
| 6,524,880 B2 * | 2/2003 | Moon et al. .................. 438/57 |
| 6,594,542 B1 * | 7/2003 | Williams .................... 700/164 |
| 2002/0034611 A1 * | 3/2002 | Masuko et al. ............. 428/168 |
| 2002/0162218 A1 * | 11/2002 | Skorupski et al. ............ 29/847 |
| 2003/0160026 A1 * | 8/2003 | Klein et al. .................. 216/83 |

FOREIGN PATENT DOCUMENTS

| | | |
|---|---|---|
| EP | 0 524 826 A1 | 1/1993 |
| EP | 0773590 A1 | 5/1997 |
| EP | 0851511 A1 | 7/1998 |

OTHER PUBLICATIONS

"*A new passivation method for edge shunts of silicon solar cells*", M. Al-Rifai, et al., 17th European Photovoltaic Solar Energy Conference and Exhibition, Munich, Germany, Oct. 22-27, 2001.

European Search Report of EP 03447176.3 dated Sep. 3, 2003.

* cited by examiner

SEMICONDUCTOR ETCHING PASTE AND THE USE THEREOF FOR LOCALIZED ETCHING OF SEMICONDUCTOR SUBSTRATES

FIELD OF THE INVENTION

The present invention relates to a cost-effective method for producing semiconductor devices, especially solar cells as well as the semiconductor devices or cells thus produced. Particularly, the present invention is related to a method for forming solar cells on a high-throughput production line. More particularly, the present invention relates to methods of etching substrates, such as the substrate of a solar cell, as well as etchant pastes for use in carrying out the etching method.

BACKGROUND OF THE INVENTION

Low or medium efficiency solar cells need to be produced in a very efficient way in order to keep the overall costs as low as possible. Such low cost solar cells are typically manufactured in a continuous high throughput production line, in which handling of wafers must be kept to a minimum. The number of process steps should be as low as possible and the process steps must preferably allow such continuous processing without interruption. Examples of such processes are given in European Patent Application No. 979546694 entitled "Semiconductor device with two selectively diffused regions" and in U.S. Pat. No. 5,726,065 entitled "Method of Preparing Solar Cells Front Contacts".

The "front end" process of preparing a solar cell comprises the steps of (see FIG. 1): providing a starting semiconductor substrate, typically a low cost substrate (1), such as a polycrystalline or multicrystalline p-type silicon wafer (FIG. 1a); substrate cleaning between different steps; surface texturing, e.g., using wet chemicals to roughen the front surface (2) of the substrate (FIG. 1b) as disclosed e.g. in European Publication EP-773590-A1 entitled "Solar cell comprising multicrystalline silicon and method of texturing the surface of P-type multicrystalline silicon"; forming the emitter region (3) (FIG. 1c), as, e.g., described in European Application No. 979546694 entitled "Semiconductor device with two selectively diffused regions", by phosphorus solid source doping of the wafer in a furnace to form the emitter region (3) and furnace diffusion of the phosphorus dopants; and etching the phosphorus oxide or phosphorus glass formed during the previous phosphorus solid source doping.

The substrate is doped in all surfaces that are exposed to the gaseous environment. Not only the front, but also the edges, openings in the substrate, and the uncovered areas of the back side of the wafer will be doped.

The "back end" process of preparing a solar cell comprises the steps of (see FIG. 1): forming contacts (4) to the emitter (3), e.g. by screen printing on the front side (2) a paste comprising metal particles and using a thermal step to sinter these metal particles to the semiconductor substrate, such as in the firing step as disclosed, e.g., in U.S. Pat. No. 5,698,451 (FIG. 1d); forming contacts (5) at the back side (6) of the bulk region (7) which is of a conductivity type, e.g., p-type, opposite to the emitter dopant type, e.g., n-type. This can also be done by the screen-printing and firing technique used for the emitter contacts (FIG. 1e).

The firing step of the emitter-contacts (4) and the back-contacts (5) can be done simultaneously.

A significant problem arising from continuous high throughput solar cell processes is the isolation of the n-type emitter (3) and the p-type collector bulk contacts so that no electrical short circuit of the diode occurs. In order to avoid the shunting or short-circuiting of the emitter contacts (4) to the bulk contacts (5), no overlap (9) or direct electrical contact between the n-type emitter region (3) and the bulk contacts (5) is allowed. Various methods are employed to prevent such overlap, and some of these methods are presented below. These methods can be categorized into patterned methods and unpatterned methods, depending upon whether the separation of the both regions is adjustable, i.e., layout dependent, or fixed, i.e., done by employing a given toolset.

Examples of such patterned methods include the following. During the step of doping the emitter, the bulk contact region is masked (8) with a given overlap over the bulk contact region (5) and this part of the surface remains p-type doped (see FIG. 2a). This masking material needs to be removed without affecting the solar cell. Such an approach is disclosed in European Application No. 979546694 entitled "Semiconductor device with two selectively diffused regions."

During the emitter doping step the perimeter of the bulk contact region (5) is masked (8). The bulk region itself, however, will be n-type doped. During subsequent processing of the bulk contacts, counter-doping is needed, e.g., by the diffusing or alloying with the metal paste, to compensate for this n-type doping within area bordered by the masking perimeter and to convert the contact region (5) into a p-type doped region (see FIG. 2b). This masking material needs to be removed without affecting the solar cell.

Instead of masking the perimeter (8) of the bulk contact region, as disclosed above, a paste can be dispensed as shown in FIG. 2d. This paste (11) can electrically isolate the back side contact (5) from the emitter regions (3) in three ways. During subsequent processing, the paste (11) reduces the dopant level of the emitter region underneath the dispensed ring (11). This reduction can occur, e.g., by removing the n-type dopants in the emitter region located underneath the paste area (11). The paste can, e.g., dissolve the semiconductor material of the substrate underneath it, whereby the dopants present in this affected region have a different solubility in the dissolved material at the given process temperature than at the temperature at which they were introduced earlier in the process. The excess dopants can be absorbed by the paste material. Such a method is disclosed in European Application No. 56169378, which discloses using a paste that melts the silicon; during subsequent processing the paste (11) counter-dopes the emitter regions underneath the dispensed ring. By alloying the substrate underneath with dopants present in the paste (11), a p-type region is formed extending from the back surface (6) throughout the emitter region (3) to the bulk region (7). Such a method is disclosed in Japanese Application No. 5619378, which discloses using an aluminum-based paste for counter-doping.

Examples of unpatterned methods include the following. In "High throughput laser isolation of crystalline silicon solar cells" by G. Emanuel, 17th European Photovoltaic Solar Energy Conference and Exhibition, Munich, Germany 22–26, Oct. 2001, application of laser technology to isolate the edges of solar cells was described. The laser scribing evaporates the substrate material on the back surface and hence a groove is formed separating the n-doped surface regions from the contact regions to the p-doped bulk. Sometimes the edges (10) of the wafers are removed. In "A new passivation method for edge shunts of silicon solar cells" by M. Al-Rifai et al., 17th European Photovoltaic Solar Energy Conference and Exhibition, Munich, Germany 22–26, Oct. 2001, a method is described wherein wafers are first stacked. On the edges of this wafer stack, a KOH aqueous solution is applied by means of a sponge. Then, the wafer stack with the wetted edges is heated up until the reaction temperature of the KOH solution is reached. At this temperature the KOH starts to etch the silicon, thereby removing n-type doped edge regions. A device prepared according to this method is shown in FIG. 2c. A disadvantage of this technique is that the stacked wafers vary in size, typically by about 0.5 mm, and hence not only the edges but also the front and/or back surfaces of the substrate are etched, resulting in a smaller active area. Stacked wafers also need additional wafer handling that can cause damage to the substrate surface. The time between applying the KOH aqueous solution and etching the edges should be limited as much as possible to make sure that the etching liquid remains on the substrate and to avoid drying out or evaporating the etching liquid. This disadvantage is related to the fact that an etching liquid can not be confined to a given area.

In U.S. Pat. No. 5,894,853 (Fujisaki Tatsuo et al.), U.S. Pat. No. 5,688,366 (Ichinose Hirofumi et al.), U.S. Pat. No. 6,388,187 (Kusakari Masayuki et al.) and U.S. Pat. No. 5,296,043 (Kawakami Soichiro et al.), etching pastes are disclosed for etching transparent conducting films, for example, Indium Tin Oxide (ITO). ITO is considered as a conductive compound and is not considered in the art as a semiconductor substrate such as silicon or germanium.

SUMMARY OF THE INVENTION

The preferred embodiments provide semiconductor devices and methods of forming the semiconductor devices in which etching steps are simplified. In particular, the preferred embodiments provide semiconductor devices and methods of forming these semiconductor devices in which a simpler etching step is used to electrically isolate regions of a semiconductor substrate from each other. The semiconductor device may be a solar cell. Preferably the method only requires one additional step performed on the back side of the substrate, without changing the process complexity or thermal budget.

The preferred embodiments also provide a new, natural or synthetic etchant material which simplifies etching of patterns into substrates.

In a preferred embodiment, a method of etching a substrate is provided comprising applying a paste containing a caustic, e.g. basic or alkaline etchant to the substrate, and carrying out a thermal processing step to etch a part or a layer of the substrate where the paste has been applied.

In a preferred embodiment, a method of etching a semiconductor substrate is provided comprising applying a paste containing an etchant to the substrate, and carrying out a thermal processing step to etch a part or a layer of the substrate where the paste has been applied. The etchant paste is preferably a caustic, e.g., basic or alkaline paste. The etchant paste may be applied selectively to a major surface of the substrate to form a pattern of applied paste. The paste is applied, e.g., by a printing method such as screen printing.

The etchant is preferably applied to a surface-doped region of the semiconductor substrate. The doping of a region of the substrate is preferably conducted before the paste-applying step, and the etchant paste may be applied to the doped region of the substrate. The substrate may be part of a solar cell and the doping step may include the formation of an emitter region.

The preferred embodiments also provide a solar cell manufactured by the above methods.

The preferred embodiments also provide an etchant paste suitable for selective deposition onto a substrate to be etched. The substrate may be a semiconductor substrate. The etchant paste is preferably modification to be used in a selective deposition method, such as screen-printing. This modification may mainly be related to the viscosity of the paste at application temperatures, e.g., at room temperature. The etchant paste preferably etches the substrate at a high rate only above an elevated temperature, e.g., at 50° C. or higher, so that room temperature application does not cause the reaction to start immediately. The etchant paste comprises a caustic, e.g., basic or alkaline, etching agent such as potassium hydroxide (KOH), sodium hydroxide (NaOH), ammonium hydroxide ($NH_4OH$) or combinations or derivatives of these. The etchant paste is preferably water-based. The etchant paste preferably comprises water, a caustic, e.g., basic or alkaline, agent and a thickener to increase the viscosity sufficiently such that the paste can be selectively deposited. Such a thickener may include a metal carboxyalkylcellulose salt such as sodium or potassium carboxymethylcellulose (Na or K CMC). Generally, hydrocolloid-forming cellulose or starch products or derivatives, or physically or chemically modified hydrocolloid-forming cellulose or starch products or derivatives are preferred. The modification may include, for example, partial or complete cross-linking of the material. The thickener can be natural, for example, Agar Gum or Xanthan Gum. The advantages of a natural thickener are straightforward since they can be handled more easily with respect to health precautions, they can be recycled more easily, safety protection is easier, etc. The thickener may also be a completely synthetic material such as strongly hydrolyzed polyacrylamide gels such as acrylamide/sodium or potassium acrylate copolymer gels. The combination of etching agent, substrate, and heat processing conditions may be selected to provide either anisotropic etching or isotropic etching.

In a first embodiment, a method of etching a semiconductor substrate is provided, the method including the steps of applying an etching paste including an etchant to a part or a layer of the substrate; and heating the substrate, such that the part or the layer of the substrate upon which the etching paste has been applied is etched.

In an aspect of the first embodiment, the etching paste includes a caustic etching paste.

In an aspect of the first embodiment, the etching paste is basic.

In an aspect of the first embodiment, the etching paste is alkaline.

In an aspect of the first embodiment, the etching paste includes a synthetic etching paste.

In an aspect of the first embodiment, the etching paste includes a natural etching paste.

In an aspect of the first embodiment, the semiconductor substrate is selected from the group consisting of a microcrystalline silicon substrate, a polycrystalline silicon substrate, an amorphous silicon substrate, a doped silicon substrate, a gallium arsenide substrate, a gallium arsenide phosphide substrate, a germanium substrate, and a silicon germanium substrate.

In an aspect of the first embodiment, the etching paste is applied selectively to a major surface of the substrate to form a pattern of applied paste.

In an aspect of the first embodiment, the etching paste is applied by a selective deposition method.

In an aspect of the first embodiment, the selective deposition method includes screen-printing.

In an aspect of the first embodiment, the method further includes the step of: doping a region of the substrate to yield a doped region of the substrate, wherein the step of doping is conducted before the step of applying an etching paste, and wherein the step of applying an etching paste includes applying an etching paste to the doped region of the substrate.

In an aspect of the first embodiment, the substrate includes a part of a solar cell, and wherein the doped region includes an emitter region of the solar cell.

In an aspect of the first embodiment, the etching paste is applied to at least one edge of the substrate.

In an aspect of the first embodiment, the method further includes the steps of: forming at least one metal contact on a base region of the substrate; and forming at least one metal contact on an emitter region of the substrate.

In an aspect of the first embodiment, the heating step yields an insulating region, wherein the insulating region is situated between the emitter region and the base region so as to isolate a metal contact from the emitter region.

In an aspect of the first embodiment, a solar cell is manufactured by the method.

In a second embodiment, a semiconductor substrate upon which an etching paste is deposited is provided, the etching paste including a solvent and a caustic etching agent.

In an aspect of the second embodiment, the etching paste further includes a thickener.

In an aspect of the second embodiment, the caustic etching agent is basic.

In an aspect of the second embodiment, the caustic etching agent is alkaline.

In an aspect of the second embodiment, the caustic etching agent is selected from the group consisting of potassium hydroxide, sodium hydroxide, ammonium hydroxide, combinations thereof, and derivatives thereof.

In an aspect of the second embodiment, the solvent includes water.

In an aspect of the second embodiment, the thickener is selected from the group consisting of a metal carboxyalkylcellulose salt, a hydrocolloid-forming cellulose, a starch, a physically modified hydrocolloid-forming cellulose, a chemically modified hydrocolloid forming cellulose, a physically modified starch, a chemically modified starch, a strongly hydrolyzed polyacrylamide gel, combinations thereof, and derivatives thereof.

In a third embodiment, an etching paste suitable for use in etching a semiconductor substrate is provided, the etching paste including: a solvent; a caustic etching agent selected from the group consisting of potassium hydroxide, sodium hydroxide, ammonium hydroxide, combinations thereof, and derivatives thereof, and a thickener selected from the group consisting of a metal carboxyalkylcellulose salt, a hydrocolloid-forming cellulose, a starch, a physically modified hydrocolloid-forming cellulose, a chemically modified hydrocolloid forming cellulose, a physically modified starch, a chemically modified starch, a strongly hydrolyzed polyacrylamide gel, combinations thereof, and derivatives thereof.

In an aspect of the third embodiment, the caustic etching agent includes potassium hydroxide, wherein said thickener includes sodium carboxymethylcellulose, and wherein said solvent includes water.

DETAILED DESCRIPTION OF THE PREFERRED EMBODIMENT

The following description and examples illustrate a preferred embodiment of the present invention in detail. Those of skill in the art will recognize that there are numerous variations and modifications of this invention that are encompassed by its scope. Accordingly, the description of a preferred embodiment should not be deemed to limit the scope of the present invention. The present invention will be described with reference to certain embodiments and drawings but the skilled person will appreciate that the invention as claimed in the attached claims has advantageous use beyond these exemplary embodiments. In particular the present invention will mainly be described with reference to applications in and with solar cells but the presented invention is not limited thereto.

In preferred embodiments, the term "substrate" may include any underlying material or materials that may be used, or upon which a device, a circuit or an epitaxial layer may be formed. In preferred embodiments, this "substrate" may include a semiconductor substrate such as, e.g., a microcrystalline silicon, a polycrystalline silicon, an amorphous silicon, a doped silicon, a gallium arsenide (GaAs), a gallium arsenide phosphide (GaAsP), a germanium (Ge), or a silicon germanium (SiGe) substrate. The "substrate" may include, for example, an insulating layer such as a glass, $SiO_2$ or a $Si_3N_4$ layer in addition to a semiconductor substrate portion. Thus, the term "substrate" also includes silicon-on-insulator (SOI), silicon-on-glass, and silicon-on sapphire (SOS) substrates. The term "substrate" is thus used to define generally the elements of layers that underlie a layer or portions of interest. Also, the "substrate" may be any other base on which a semiconductor layer is formed, for example, a glass, ceramic, or metal layer. In the following description, processing will mainly be described with reference to silicon processing, but the skilled person will appreciate that the preferred embodiments may be implemented based on other semiconductor material systems. The skilled person can select suitable materials as equivalents of the dielectric and conductive materials described below.

Figure 1:
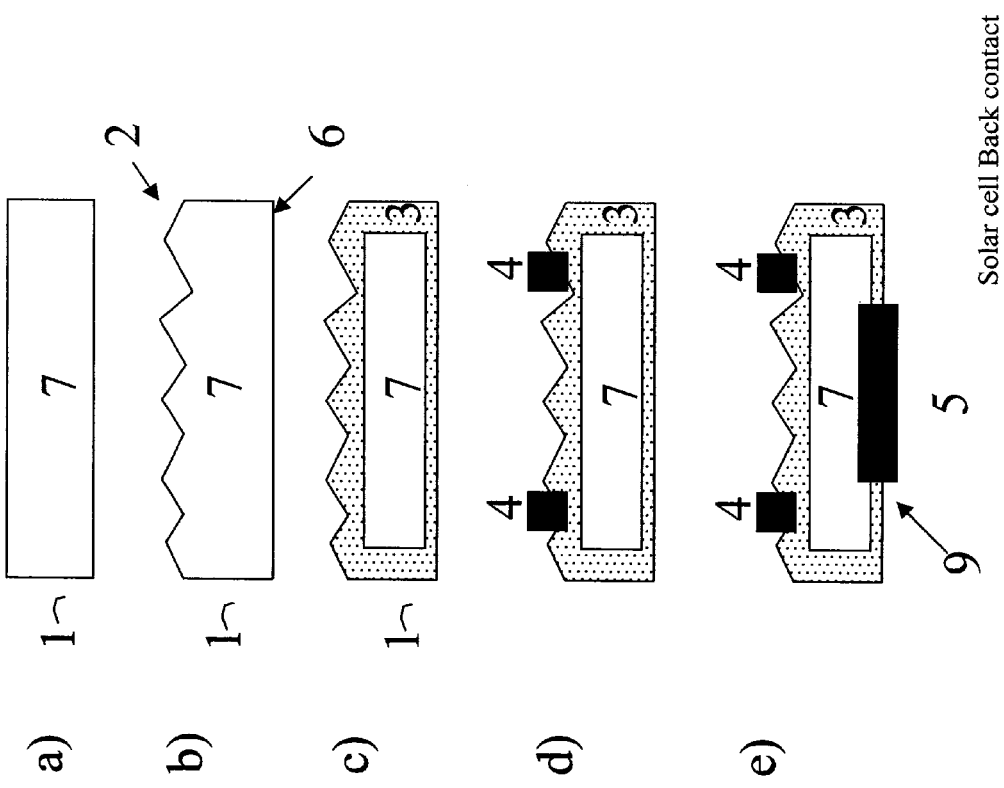
FIGS. 1a–1e show a process flow according to the prior art.
Figure 2:
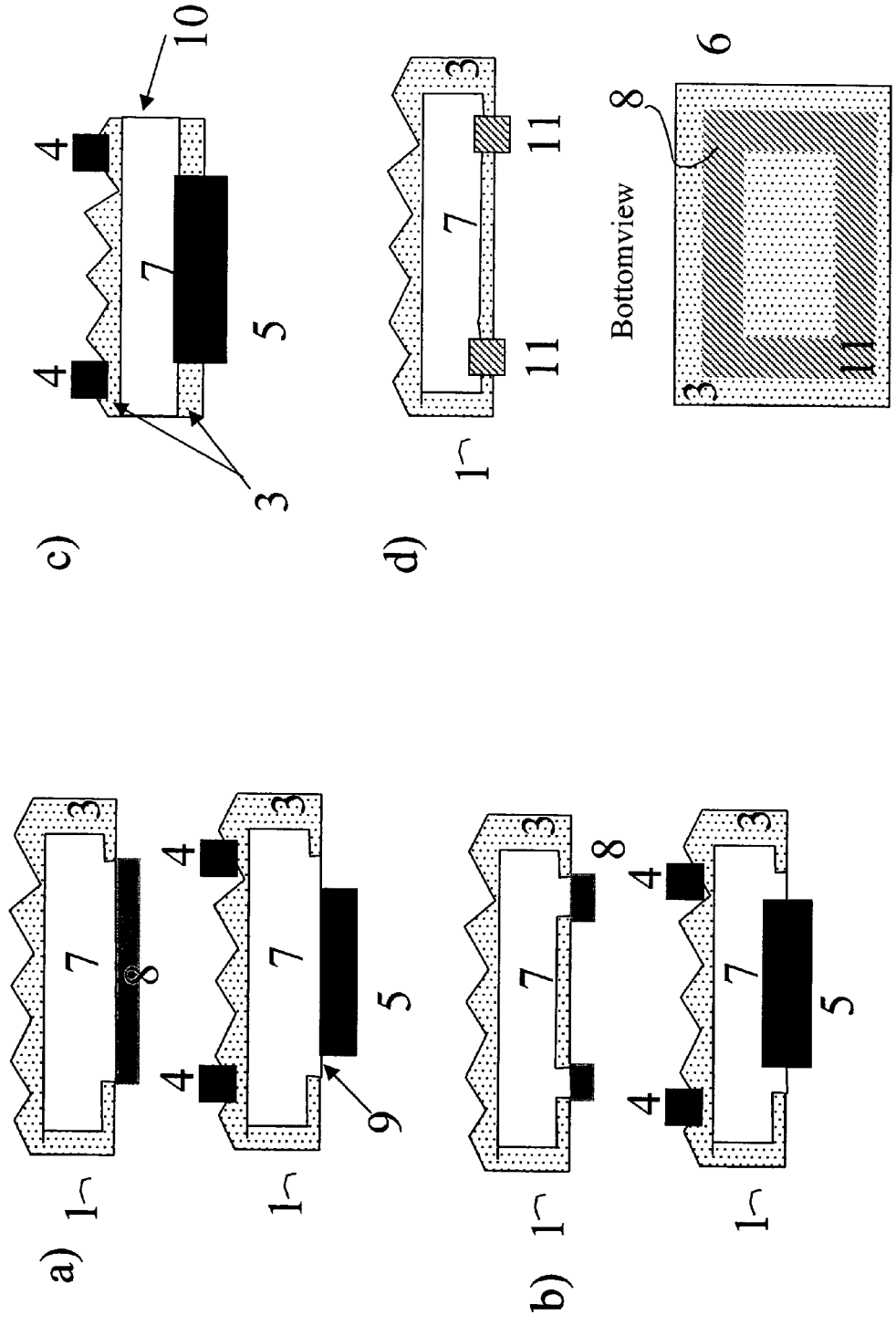
FIGS. 2a–2d show a process according to prior art.
Figure 3:
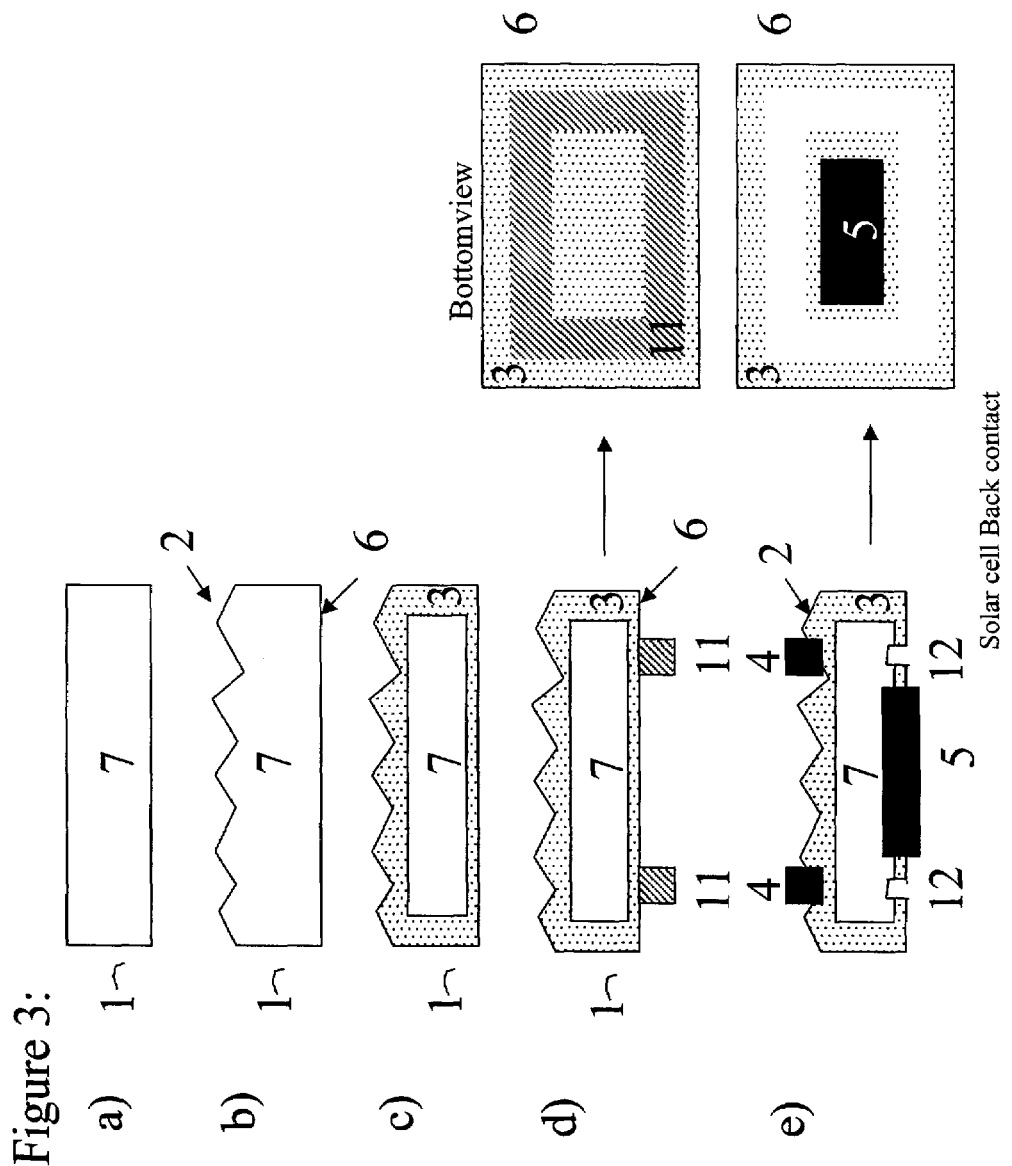
FIGS. 3a–3f show a process according to a preferred embodiment.
Figure 3:
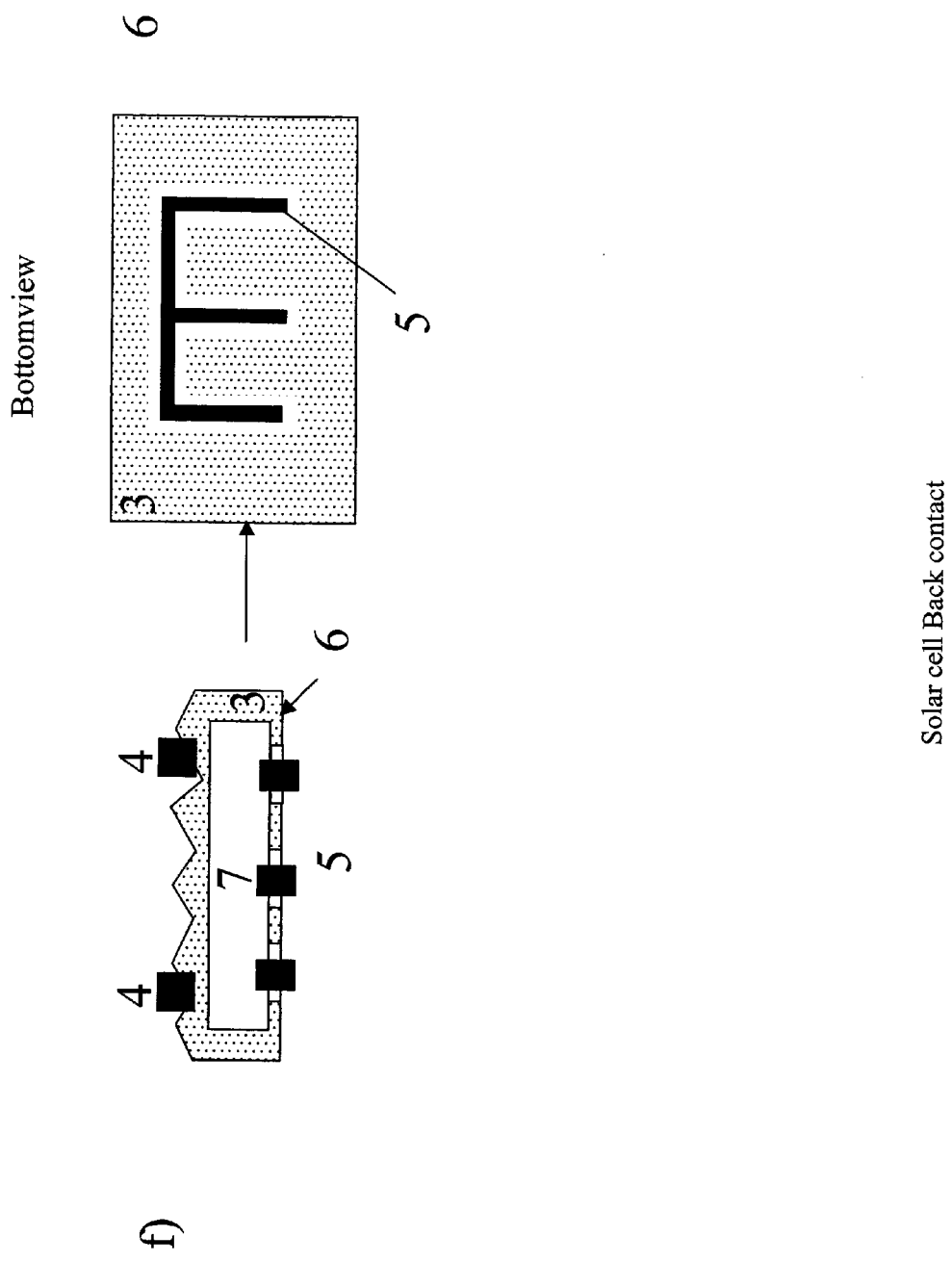

In a first aspect of the preferred embodiments, a method for insulating back contact regions from emitter regions, e.g., in a solar cell, is disclosed. The process flow is shown in FIG. 3. Processing steps may comprise front end processing as generally described for FIG. 1, namely: providing a starting semiconductor substrate, typically a low cost substrate (1), such as polycrystalline or multicrystalline p-type silicon wafer (FIG. 3a); substrate cleaning between different steps; surface texturing, e.g., using wet chemical to roughen at least the front surface (2) of the substrate (FIG. 3b), for example, as disclosed in European Publication EP-773590-A1 entitled "Solar cell comprising multicrystalline silicon and method of texturing the surface of P-type multicrystalline silicon"; forming the emitter region (3)

(FIG. 3c), as described, e.g., in European Application No. 979546694 entitled "Semiconductor device with two selectively diffused regions" by doping the emitter region (3), e.g., by a gaseous or solid source doping step of the wafer using a suitable dopant such as phosphorus. Where a solid dopant is used this dopant can be diffused into the substrate using a furnace. The substrate is doped in all surfaces that are exposed to the gaseous environment; etching away any residues such as phosphorus oxide or phosphorus glass formed during the previous solid source doping step; forming contacts (4) to the emitter (3) by any suitable process, e.g., by using a printing process such as screen printing a paste onto the front side (2), the paste comprising metal particles, and using a high temperature thermal step to sinter these metal particles to the semiconductor substrate, e.g., carrying out a firing step as disclosed, e.g., in U.S. Pat. No. 5,698,451; forming contacts (5) at the back side (6) of the bulk region (7) which is of a conductivity type, e.g., p-type, opposite to the emitter dopant type, e.g., n-type. This can also be done by a screen-printing and firing technique used for the emitter contacts (FIG. 3e), for example. The firing step of the emitter-contacts (4) and the back-contacts (5) can be done simultaneously.

This embodiment further uses an etching paste that can be dispensed in a controlled way. The paste preferably includes as one component a basic or alkaline caustic agent. The paste or similar material may be selectively applied at least to one major surface of the substrate in a defined pattern which may take the form of lines and/or areas. The paste is selectively applied to those regions of the substrate surface where isolation regions are to be formed in a later step. Various techniques may be used to apply the paste selectively to the substrate. Application of the paste is preferably carried out in a very defined and reproducible way. Thick film techniques for applying metal and/or doping pastes exhibit an excellent repeatability. Preferred techniques having good repeatability include, e.g., screen, offset, gravure, or ink jet printing or paste writing. The paste is preferably printed onto the substrate by thick film techniques such as screen-printing in order to give good repeatability in a high volume production process. It is advantageous to use the same technique for applying dopant paste, etching paste, and metal paste. A DEK model 1760RS screen printer may be used to apply one or more of the pastes.

Alternative paste application methods are included within the scope of the preferred embodiments. For instance, a lift off layer may be applied in a selective pattern on the substrate which is the inverse of the pattern of paste to be applied. The paste is then applied uniformly over the whole are of the substrate. The lift off layer is then removed with the overlying paste to form a pattern of applied paste remaining on the substrate.

The viscosity of the etching paste is preferably selected so that it may be applied accurately by the appropriate technique, e.g., screen printing, but does not flow or spread significantly on the substrate. The etchant paste preferably has a viscosity which allows it to be applied as a flowable and/or malleable material but which reduces its ability to spread once applied. A thixotropic etchant paste can be advantageously employed. The viscosity of the etchant paste is preferably high enough to prevent significant lateral flow before or during a subsequent heat treatment step that would lead to significantly wider lines or areas of applied paste than desired. However, a small lateral widening of the lines or areas of paste beyond the intended lines or areas is usually permissible.

Preferably, the paste is heat processed immediately or soon after application to the substrate if lateral spreading of the paste is a concern. In such a case, the patterned substrate is preferably loaded as quickly as possible into an oven in which the viscous paste can be heated. For the heat processing step, a Tempress conveyor belt dryer, a DEK infrared belt dryer, or similar device may be used. The temperature is raised to above 50° C., and preferably to between about 50° C. and 150° C. to complete the etching step.

A process sequence according to a preferred embodiment is illustrated in FIG. 3, especially in FIGS. 3d, 3e, and 3f. On the back side (6) of the substrate (1) the etching paste (11) is dispensed parallel to but outside the perimeter of the region of the back side which will receive the back side contact area (5) (FIG. 3d). The dispensing step may be carried out by any suitable process, e.g., by a printing procedure such as screen-printing. This etching paste (11) can be dispensed in the same production line as the one described above. The only additional requirement is an additional screen-printing chamber, similar to the chamber used to define the front contacts (4).

The step of dispensing the etching paste (11) can be done after the step of doping the emitter region (3) (FIG. 3c), during which the emitter dopants will diffuse into the substrate (7). In particular, the etching paste may be applied in the same step as depositing the metal particle-containing paste for the contacts (4, FIG. 3d). This etching paste (11) preferably etches the surface of the substrate in such a manner and to such a depth that it insulates the bulk contact regions (5) from the emitter regions. The steps of dispensing, e.g., by means of screen-printing, the etching paste (11) and the etching of the substrate can be done separately. The etching paste can be dispensed, e.g., at room temperature or at an elevated temperature which is still low enough such that the substrate is essentially not etched by the etching paste. The substrate (7) and the dispensed etching paste (11) can be moved to an annealing or heating chamber in which the etching can take place. Depending on the properties of the paste, the time between the dispensing and the heating can be selected as desired, e.g., minutes, hours, or days. If the paste is applied in a similar manner to that of the metal paste described above, similar tools can be used for dispensing the paste and for wafer handling. When the glass residues, resulting from the doping of the emitter, are etched off, the etching paste can be also be removed. This removal is preferably done at room temperature. For instance, the substrate may be rinsed with water so that the residues of the etching paste are diluted and are not reactive enough to etch the substrate.

Figure 4:
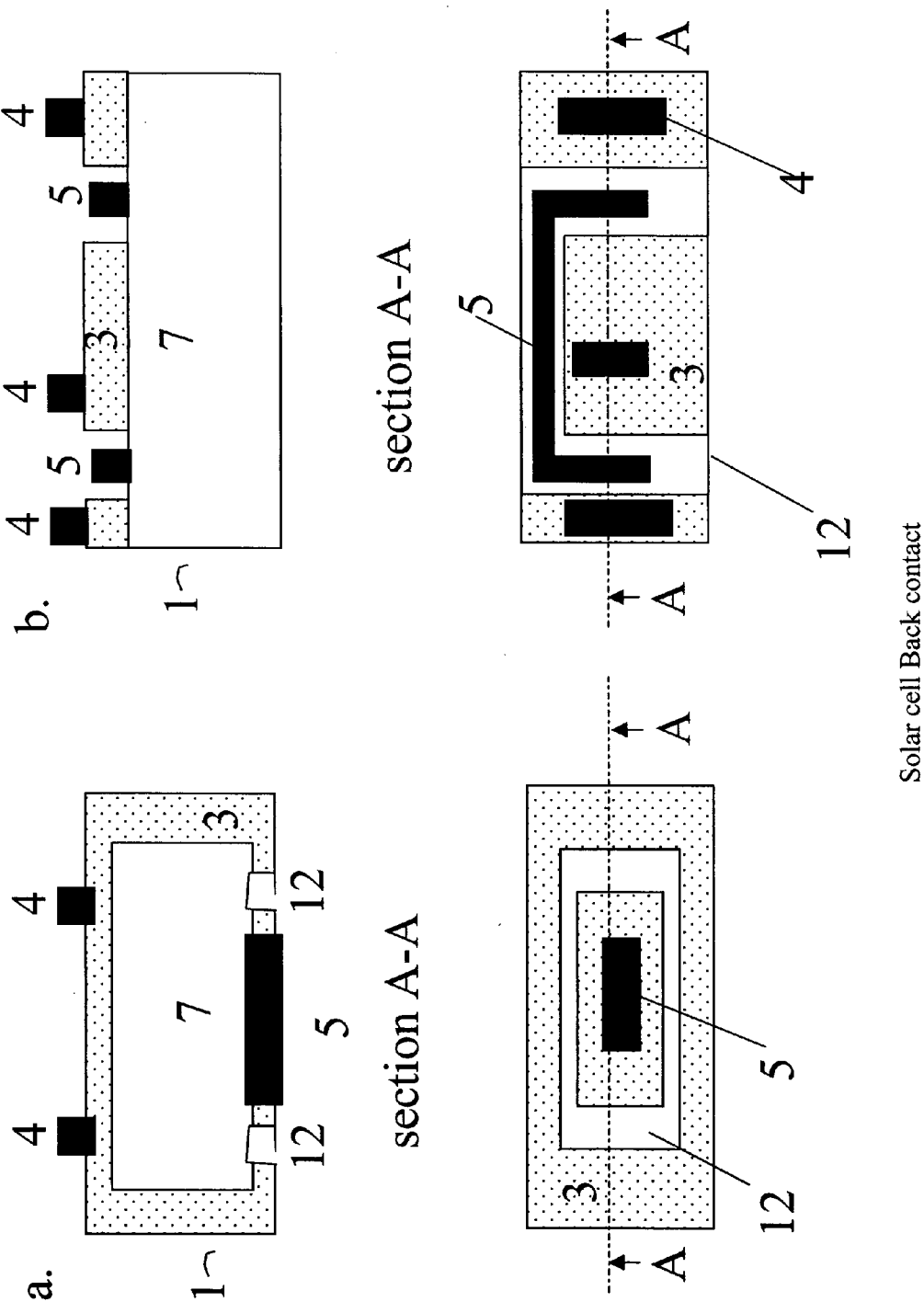
FIGS. 4a and 4b show schematic representations of solar cells made in accordance with a preferred embodiment.

FIGS. 4a and 4b show a schematic cross-section A—A and a top view of two solar cell devices fabricated according to a further preferred embodiment. The solar cell device shown in FIG. 4a has the contacts (4) to the emitter region (3) at a first main surface of the substrate (1). The emitter region (3) may be formed in all surfaces of the substrate (1). The emitter region is interrupted at the surface opposite the first main surface by selectively applying the etching paste at a first temperature, as described above for certain preferred embodiments, and etching at a second elevated temperature, resulting in trenches (12) etched into the substrate (1). Typically, the first temperature will be room temperature, i.e., between 15 and 30° C. Within the area bordered by the trenches (12) contacts (5) to the bulk region (7) can be made. These contacts (5) extend throughout the emitter region (3) into the bulk region (7).

Figure 5:
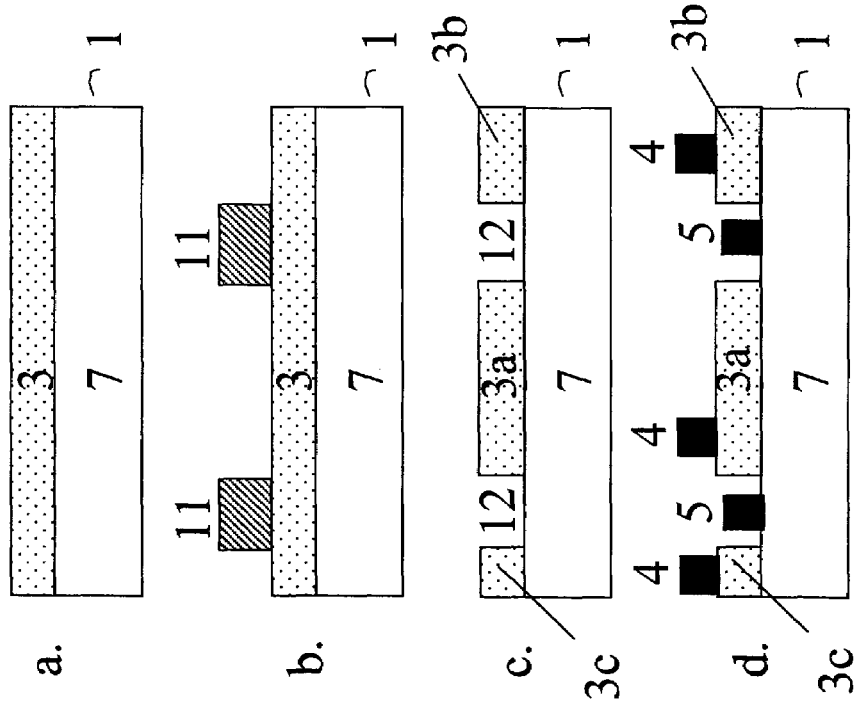
FIGS. 5a–5d show a process flow for manufacture of the solar cell of FIG. 4b.

The solar cell device shown in FIG. 4b has the contacts to the emitter region (3) and to the bulk region (7) at the same main surface of the substrate (1). FIG. 5 describes a process flow which yields such a device. In FIG. 5a, first only a first main surface is doped to form an emitter region (3) or layer in the substrate (1). The continuous emitter region (3) is interrupted and divided into separated regions (FIGS. 3a, 3b, 3c) by selectively applying the etching paste (11) to the surface comprising the emitter region (3). Trenches (12) are etched in the semiconductor substrate (1) from the first main surface onwards throughout the emitter region (3). Within these trenches, contacts (5) are formed to the exposed bulk region, while contacts (4) are also made to the isolated emitter regions (3).

In all the above embodiments, an etching paste is selectively applied onto a surface doped region of a semiconductor substrate and a heat treating step is carried out to etch through the surface region and to thereby isolate regions on one side of the etched region from regions on the other side. In particular, in a solar cell this etch isolates an electrode from the emitter region. In particular, the isolated electrode is a contact for a bulk region of the substrate.

The etching paste can be used to etch any shape into the substrate. For example, it can be used to etch only near the edges of the wafer, as shown in FIG. 3d, by selective application of the etching paste near the edges. In this case, the etching paste is applied to edges of the solar cell structure. If a more complex back side contacting structure is used, as is, done, e.g., in U.S. Pat. No. 6,384,317 entitled "Solar cell and process of manufacturing the same", the paste can be applied in a pattern corresponding to the pattern of the back contact region, as shown in FIG. 3f.

In another preferred embodiment, an etching paste is disclosed. This etching paste can be formulated to etch a semiconductor substrate, e.g., silicon. The etching paste preferably comprises at least one etching agent and a suitable viscosity-enhancing agent such as a thickening agent or thickener. Such a thickener may be a metal carboxyalkyl-cellulose salt, such as sodium or potassium carboxymethyl-cellulose. Generally, hydrocolloid-forming cellulose or starch products or derivatives, or physically or chemically modified hydrocolloid forming cellulose or starch products or derivatives are preferred. The modification may include, for instance, partial or complete cross-linking of the material. The thickener may be a completely synthetic material, such as strongly hydrolyzed polyacrylamide gels such as acrylamide/sodium or potassium acrylate copolymer gels, see, for instance, U.S. Pat. No. 4,605,689. The composition may also include other elements, such as an extender or a thixotropic agent, or may have thixotropic properties intrinsically.

The etching agent can be an aqueous solution of an etchant capable of etching a semiconductor substrate. The etching agent can be caustic in nature, e.g., basic or alkaline. For example, the etching agent can be a solution of a hydroxide, such as a hydroxide of a metal (e.g., of a light metal such as an alkali metal), such as KOH, NaOH, CeOH, or RbOH. The etching agent can also be a non-metal hydroxide such as $NH_4OH$ or $(CH_3)_4OH$, both of which have the advantage that they do not contain a metal ion. The etching agent may also comprise a mixture of any of the agents mentioned above. All such etching agents can be alkaline or basic.

Preferable properties of the etching agent include: that it is water-based (because this allows selection of a wide range of thickeners); that it has a reaction/etching temperature of the substrate to be etched that is above room temperature or application temperature so as to allow clean separation of the dispensing step and the etching step; that it is suitable for use in a selective deposition method, such as screen printing or another printing method; that it etches the relevant substrate, e.g., a semiconductor substrate, for instance, at least one of silicon, germanium and gallium arsenide, especially amorphous silicon, microcrystalline silicon, or polycrystalline silicon.

A preferable characteristic of the thickener is that it binds water-based etching solutions to thereby increase the viscosity to such a level that a paste is formed. Further, it should be inert with respect to the caustic etching agent or react slowly enough such that it does not affect the etching process.

In a preferred embodiment, the etching agent is KOH or another hydroxide and the thickener is sodium carboxymethylcellulose. This thickener is used in food and pharmaceutical applications to bind aqueous solutions and to create, e.g., gels. A suitable composition comprises 10 to 15% by weight of KOH in water and 1 to 5% by weight of the thickener, the remaining percentage being water. The substrate to be etched is a silicon substrate. KOH, also known as caustic potash or lye, is a caustic white solid which is used as a bleach and in the manufacture of soaps, dyes, alkaline batteries, and many potassium compounds. Methylcellulose is a powdery substance prepared synthetically by the methylation of natural cellulose and is used as a food additive, a bulk-forming laxative, an emulsifier, and a thickener. It swells in water to form a gel.

In a preferred embodiment, the etching agent is NaOH, sodium hydroxide, a white opaque brittle solid having a fibrous structure. Also referred to as sodium hydrate or caustic soda, and by extension, a solution of sodium hydroxide may be used.

The following results illustrate the effectiveness of, for example, a KOH paste according to a preferred embodiment to operate junction isolation over a larger number of wafers (20), with plasma etching as a reference method.

An amount of 150 ml of a 50% KOH solution was mixed with 3 g of Na CMC (Molecular Weight (MW) $25.10^4$ g/mole, degree of substitution (D.S.) 0.7) in order to obtain a paste. The paste's ability to etch the emitter was studied at, for example, a temperature of 95° C.

On non-metallized "cells", dark current-voltage (IV) measurements promote KOH etching compared to plasma etching as a method for junction isolation. The increase of forced current is smaller with increasing reverse voltage. On finished cells, a maximum FF for plasma etching of 75.6% was achieved, while the use of the KOH etching paste led to a FF of 76.4%.

This demonstrates that at least an equally good level of junction isolation can be achieved using KOH paste instead of plasma etching. It was also found that better ideality factors can be obtained using KOH etching.

While the invention has been shown and described with reference to preferred embodiments, it will be understood by those skilled in the art that various changes are modifications in form and detail may be made without departing from the scope and spirit of this invention. For example, the etching step described above has been applied to a solar cell, however other applications are included within the scope of the present invention, e.g., during CMOS post processing. Also, the etching need not be of the substrate itself but may be of a layer applied to the substrate, e.g., a metal layer, an oxide layer, a nitride layer, etc. The etching paste may be selected to provide anisotropic or isotropic etching.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims. All patents, applications, and other references cited herein are hereby incorporated by reference in their entirety.

What is claimed is:

1. A method of etching a semiconductor substrate, the method comprising the steps of:
   doping a region of a substrate to yield a doped region of the substrate;
   applying a caustic etching paste comprising an etchant and a thickener to the doped region of the substrate, wherein the semiconductor substrate is selected from the group consisting of a microcrystalline silicon substrate, a polycrystalline silicon substrate, an amorphous silicon substrate, a doped silicon substrate, a gallium arsenide substrate, a gallium arsenide phosphide substrate, a germanium substrate, and a silicon germanium substrate, and wherein the etchant is a water-based etchant selected from the group consisting of potassium hydroxide, sodium hydroxide, ammonium hydroxide, combinations thereof, and derivatives thereof; and
   heating the substrate, such that the part or the layer of the substrate upon which the etching paste has been applied is etched.

2. The method according to claim 1, wherein the etching paste comprises a synthetic etching paste.

3. The method according to claim 1, wherein the etching paste comprises a natural etching paste.

4. The method according to claim 1, wherein the etching paste is applied selectively to a major surface of the substrate to form a pattern of applied paste.

5. The method according to claim 1, wherein the etching paste is applied by a selective deposition method.

6. The method according to claim 5, wherein the selective deposition method comprises screen-printing.

7. The method according to claim 1, wherein the substrate comprises a part of a solar cell, and wherein the doped region comprises an emitter region of the solar cell.

8. The method according to claim 1, wherein the etching paste is applied to at least one edge of the substrate.

9. The method according to claim 1, wherein the etchant comprises potassium hydroxide.

10. The method according to claim 1, wherein the etchant comprises sodium hydroxide.

11. The method according to claim 1, wherein the etchant comprises ammonium hydroxide.

12. The method according to claim 1, wherein the thickener is selected from the group consisting of a metal carboxyalkylcellulose salt, a hydrocolloid-forming cellulose, a starch, a physically modified hydrocolloid-forming cellulose, a chemically modified hydrocolloid forming cellulose, a physically modified starch, a chemically modified starch, a strongly hydrolyzed polyacrylamide gel, combinations thereof, and derivatives thereof.

13. The method according to claim 1, wherein the etching paste comprises:
   a solvent; and
   wherein the thickener is selected from the group consisting of a metal carboxyalkylcellulose salt, a hydrocolloid-forming cellulose, a starch, a physically modified hydrocolloid-forming cellulose, a chemically modified hydrocolloid forming cellulose, a physically modified starch, a chemically modified starch, a strongly hydrolyzed polyacrylamide gel, combinations thereof, and derivatives thereof.

14. The method according to claim 1, wherein the etching paste comprises an etchant comprising potassium hydroxide, a thickener comprising sodium carboxymethylcellulose, and a solvent comprising water.

15. The method according to claim 1, wherein the etching paste further comprises a solvent.

16. The method according to claim 15, wherein the solvent comprises water.

17. A method of etching a semiconductor substrate, the method comprising the steps of:
   forming at least one metal contact on a base region of the substrate;
   forming at least one metal contact on an emitter region of the substrate;
   applying a caustic etching paste comprising an etchant and a thickener to a part or a layer of the substrate, wherein the semiconductor substrate is selected from the group consisting of a microcrystalline silicon substrate, a polycrystalline silicon substrate, an amorphous silicon substrate, a doped silicon substrate, a gallium arsenide substrate, a gallium arsenide phosphide substrate, a germanium substrate, and a silicon germanium substrate, and wherein the etchant is a water-based etchant selected from the group consisting of potassium hydroxide, sodium hydroxide, ammonium hydroxide, combinations thereof, and derivatives thereof; and
   heating the substrate, such that the part or the layer of the substrate upon which the etching paste has been applied is etched.

18. The method according to claim 17, wherein the heating step yields an insulating region, wherein the insulating region is situated between the emitter region and the base region so as to isolate a metal contact from the emitter region.

19. The method according to claim 17, wherein the etching paste comprises a synthetic etching paste.

20. The method according to claim 17, wherein the etching paste comprises a natural etching paste.

21. The method according to claim 17, wherein the etching paste is applied selectively to a major surface of the substrate to form a pattern of applied paste.

22. The method according to claim 17, wherein the etching paste is applied to at least one edge of the substrate.

23. The method according to claim 17, wherein the etchant comprises potassium hydroxide.

24. The method according to claim 17, wherein the etchant comprises sodium hydroxide.

25. The method according to claim 17, wherein the etchant comprises ammonium hydroxide.

26. The method according to claim 17, wherein the thickener is selected from the group consisting of a metal carboxyalkylcellulose salt, a hydrocolloid-forming cellulose, a starch, a physically modified hydrocolloid-forming cellulose, a chemically modified hydrocolloid forming cellulose, a physically modified starch, a chemically modified starch, a strongly hydrolyzed polyacrylamide gel, combinations thereof, and derivatives thereof.

27. The method according to claim 17, wherein the etching paste comprises:
   a solvent; and
   wherein the thickener is selected from the group consisting of a metal carboxyalkylcellulose salt, a hydrocolloid-forming cellulose, a starch, a physically modified hydrocolloid-forming cellulose, a chemically modified hydrocolloid forming cellulose, a physically modified starch, a chemically modified starch, a strongly hydrolyzed polyacrylamide gel, combinations thereof, and derivatives thereof.

28. The method according to claim 17, wherein the etching paste comprises an etchant comprising potassium hydroxide, a thickener comprising sodium carboxymethylcellulose, and a solvent comprising water.

29. The method according to claim 17, wherein the etching paste is applied by a selective deposition method.

30. The method according to claim 29, wherein the selective deposition method comprises screen-printing.

31. The method according to claim 17, wherein the etching paste further comprises a solvent.

32. The method according to claim 31, wherein the solvent comprises water.

* * * * *